United States Patent
Salvi et al.

[11] Patent Number: 5,986,514
[45] Date of Patent: Nov. 16, 1999

[54] SELF-BIASED VOLTAGE CONTROLLED OSCILLATOR (VCO) METHOD AND APPARATUS

[75] Inventors: Raul Salvi, Boca Raton; Gustavo D. Leizerovich, Miami Lakes; Peter J. Yeh, Coral Springs, all of Fla.

[73] Assignee: Motorola, Inc., Schaumburg, Ill.

[21] Appl. No.: 09/013,281

[22] Filed: Jan. 26, 1998

[51] Int. Cl.[6] .................................. H03L 7/08; H03L 7/085
[52] U.S. Cl. ............................. 331/17; 331/10; 331/1 A; 331/177 R; 331/185; 327/159; 327/160
[58] Field of Search ........................... 331/10, 14, 177 R, 331/17, 185, 186; 327/159, 160

[56] References Cited

U.S. PATENT DOCUMENTS 4,667,170  5/1987  Lofgren et al. .......................... 331/17
5,375,148  12/1994  Parker et al. ........................... 331/10 X

*Primary Examiner*—Arnold Kinkead
*Attorney, Agent, or Firm*—Scott M. Garrett

[57] ABSTRACT

A method and apparatus for biasing the voltage controlled oscillator (VCO) (110) of a Phase Locked Loop (PLL) (100) includes a bias circuit (114) providing a peak minimum/maximum voltage detector (202) tied to the control line (116) of the PLL (100). During operation, the detector (202) detects a minimum or maximum voltage on the VCO control line (116) as the bias control voltage (118) applied to the VCO (110) is varied. Detection of such a minimum or maximum voltage is equivalent to the detection of a minimum or a maximum frequency, which in turn equates to the detection of an optimal bias condition for noise.

6 Claims, 4 Drawing Sheets

SELF-BIASED VOLTAGE CONTROLLED OSCILLATOR (VCO) METHOD AND APPARATUS

TECHNICAL FIELD

This invention relates in general to voltage controlled oscillators (VCOs) and particularly to a method and/or apparatus for biasing such circuits for optimal noise performance.

BACKGROUND

Voltage controlled oscillators (VCOs) are well known in the art. The primary function of a VCO is to provide a frequency response output as a function of voltage input signal amplitude. Despite the numerous advantages associated with using a VCO to support frequency synthesis, one basic shortcoming is the need to set the VCO bias in order to establish a stable quiescent (Q) operating point. As will be appreciated, the noise performance of a VCO is greatly influenced by Q. Failure to properly set the VCO bias may result in the generation of additive noise during operation.

Traditional methods for VCO biasing rely heavily on mechanical and/or manual procedures. Such methods may include the steps of: monitoring the VCO output frequency in response to a given VCO control voltage, or monitoring the VCO control voltage at a given frequency response, and then mechanically adjusting or laser trimming a bias resistor within the VCO's bias network.

As will be appreciated, such manual tuning operations are typically labor intensive, expensive, and susceptible to environmentally induced variations such as temperature, humidity, altitude, etc. It would be extremely advantageous therefore to provide a self-biasing VCO.

BRIEF DESCRIPTION OF THE DRAWINGS

FIG; 1 is a block diagram of a Phase-Locked Loop (PLL) circuit employing the VCO biasing circuit of the present invention.

DETAILED DESCRIPTION OF A PREFERRED EMBODIMENT

Figure 1:
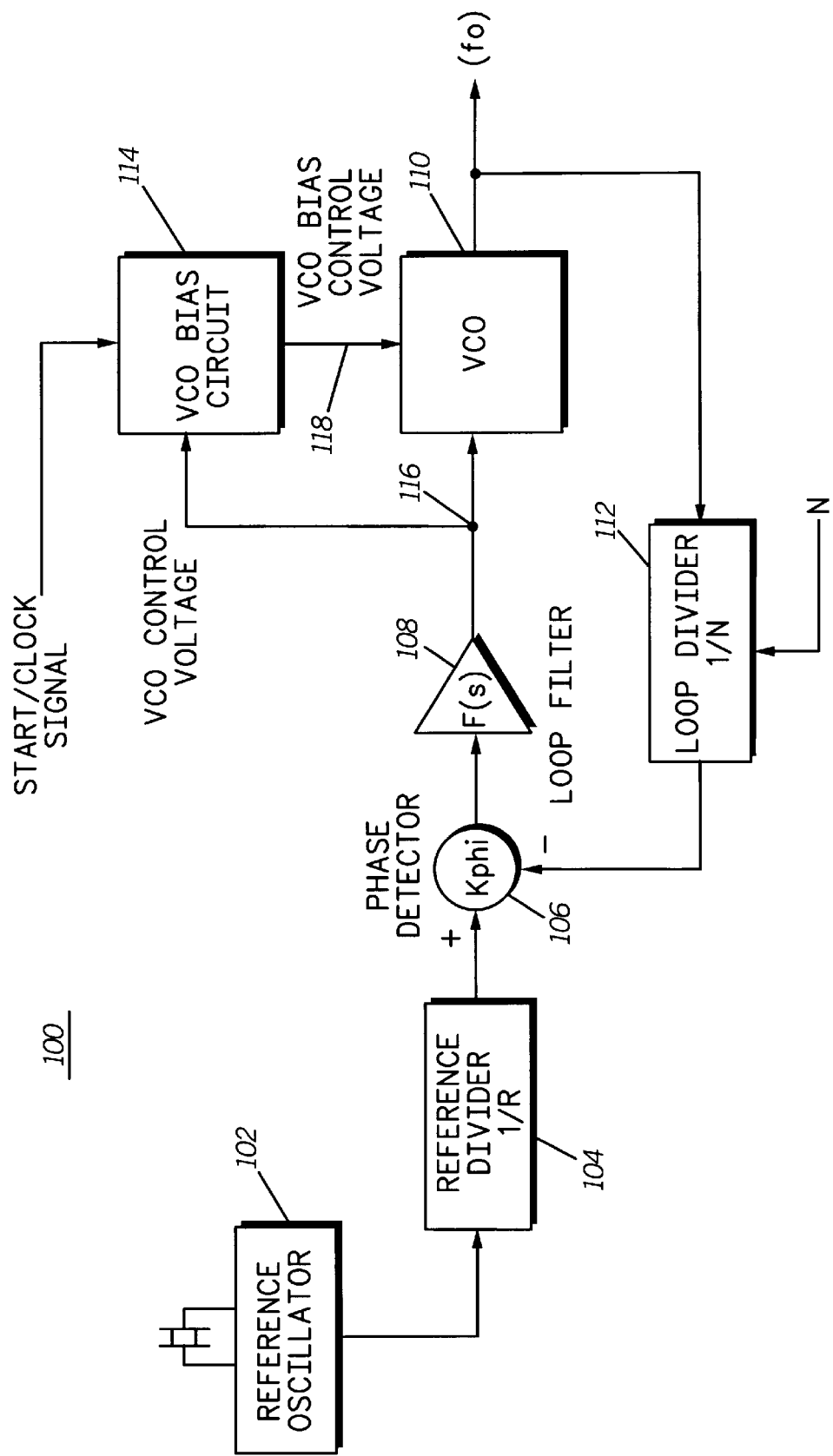

While the specification concludes with claims defining the features of the invention that are regarded as novel, it is believed that the invention will be better understood from a consideration of the following description in conjunction with the drawing figures, in which like reference numerals are carried forward.

FIG. 1 is a block diagram of Phase Locked Loop (PLL) circuit 100 like those employed within the field of telecommunications and frequently used for frequency synthesis. The PLL of FIG. 1 employs the VCO biasing circuit 114 of the present invention. As depicted, PLL circuit 100 employs a reference oscillator 102, reference divider 104, phase detector 106, loop filter 108, VCO 110, and loop divider 112. Such circuits are known in the art and will not, therefore, be described in great detail. The interested reader may nevertheless refer to U.S. Pat. No. 4,975,650 Martin, issued Dec. 4, 1990, and assigned to the assignee of the present application, for additional detail on circuit 100 theory, design, and operation. Suffice it to say, however, VCO output ($f_o$) is established by setting or programming the value N of loop divider 112.

During operation, the VCO biasing circuit 114 outputs a varying bias voltage 118 as it monitors the VCO control voltage line 116 for a maximum or minimum value. Upon detection of said maximum or minimum value, bias voltage variance is halted and a constant VCO bias control voltage 118 is thereafter supplied to VCO 110.

Figure 2:
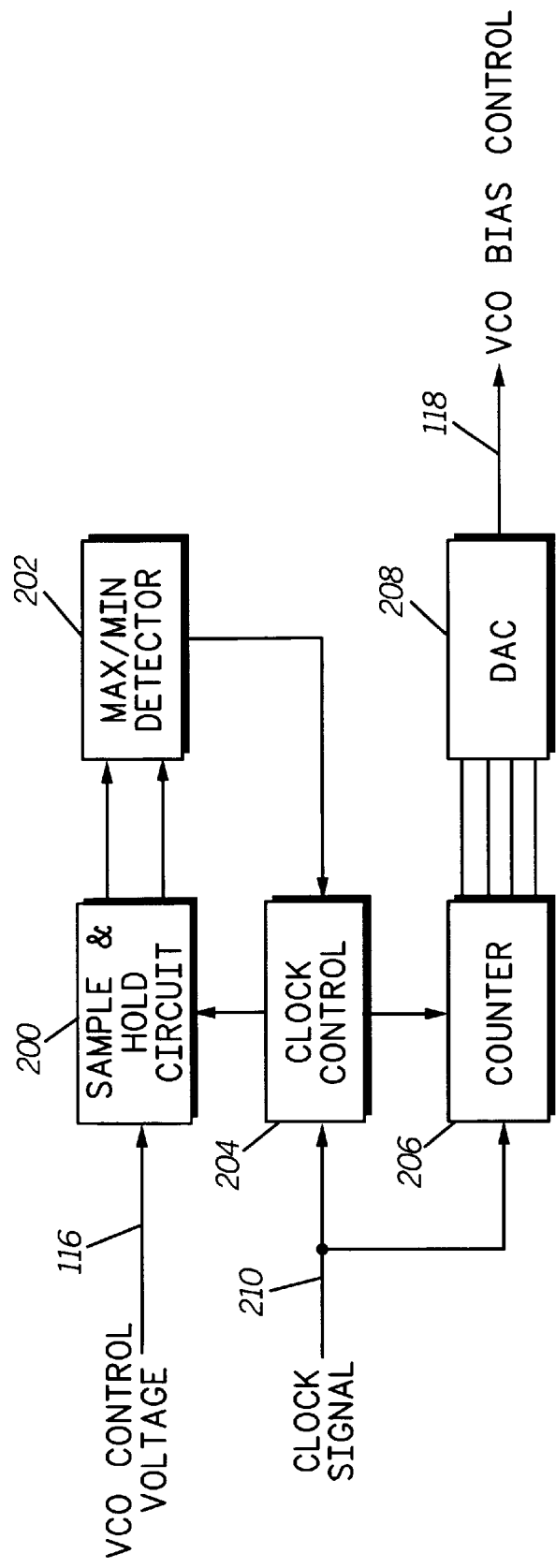
FIG. 2 is a detailed circuit diagram an embodiment of a VCO bias circuit in accordance with the present invention.

FIG. 2 is a detailed circuit diagram of the VCO bias circuit 114 of FIG. 1. In accordance with the preferred embodiment, the bias circuit 114 comprises a sample and hold circuit 200, MIN/MAX voltage detector 202, clock circuit 204, counter 206, and digital to analog converter (DAC) 208. At a systems level, the bias circuit 114 can be thought of as a peak minimum/maximum voltage detector tied to the control line 116 of the PLL 100 of FIG. 1. During operation, the detector 202 detects a minimum or maximum voltage on the control line as the bias control voltage 118 applied to a locked VCO 110 is varied. Detection of such a maximum or minimum voltage is equivalent to detecting a maximum or minimum frequency, which in turn equates to the detection of an optimal bias condition for noise.

Figure 3:
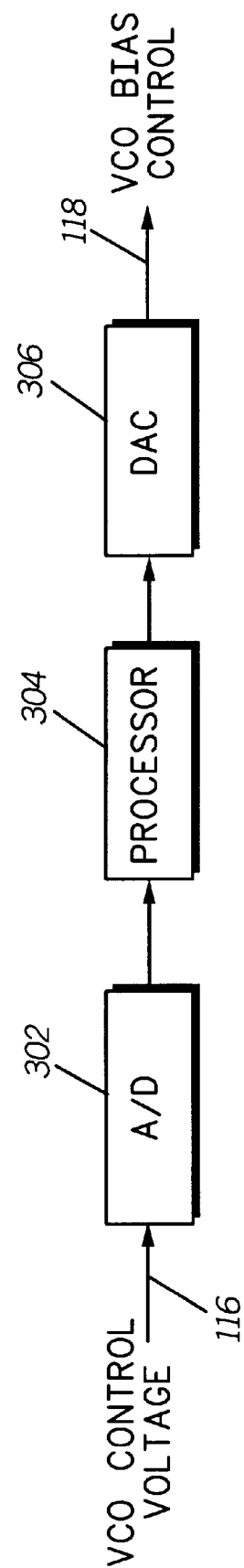
FIG. 3 is an alternate embodiment of a VCO bias circuit in accordance with the present invention.

FIG. 3 is an alternate embodiment of a VCO bias circuit 114. As will be appreciated, the processor circuit may be a microprocessor as available in the art and programmed to operate in accordance with the flow process of FIG. 4.

Figure 4:
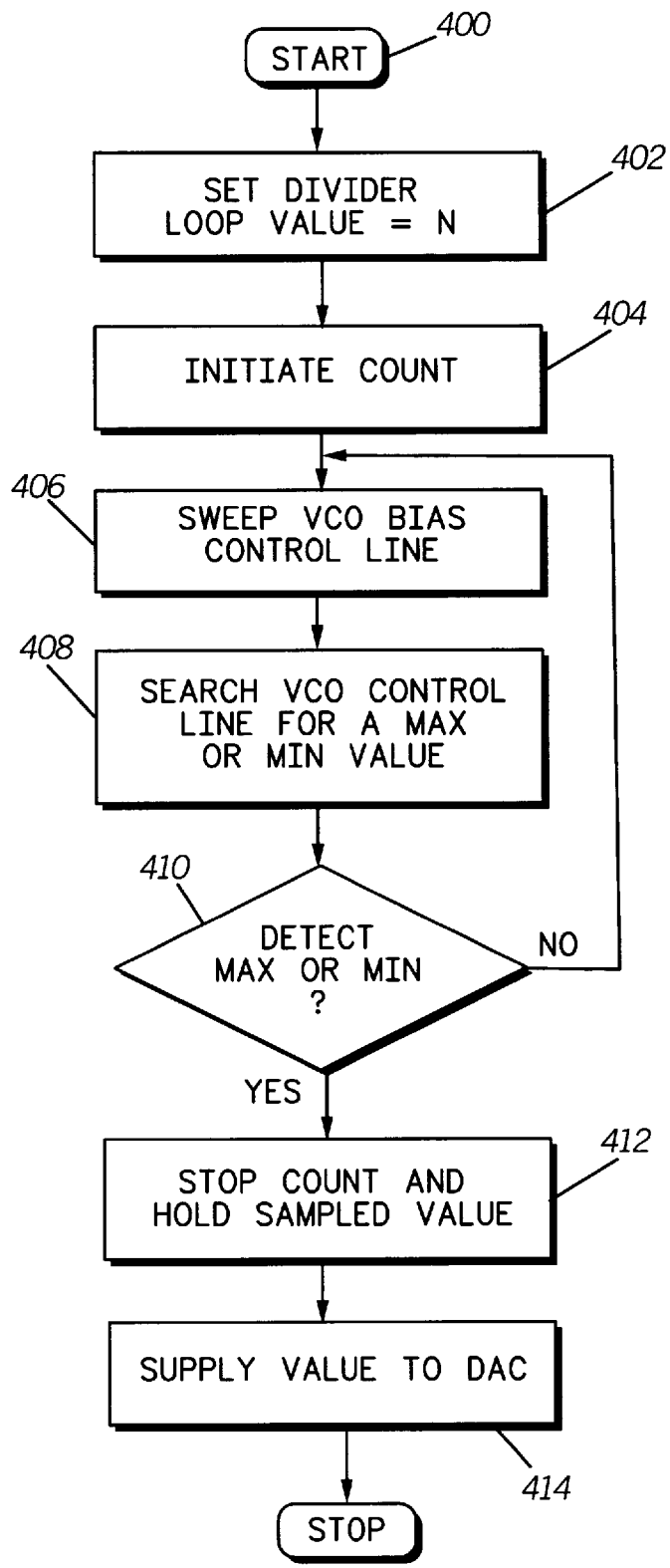
FIG. 4 is a flow chart diagram of the steps performed by a logic controlled device utilizing the VCO bias circuit of FIG. 2 or FIG. 3 and seeking to bias the VCO of FIG. 1.

FIG. 4 is a flow chart diagram of the steps performed by a logic controlled or computer controlled device such as a wireless communicator, two-way radio, radiotelephone, pager, or any other device using a phase locked loop frequency synthesizer and seeking to bias said VCO for optimal noise performance in accordance with the present invention. Commencing at start block 400, such as, for example, upon device power-up, flow proceeds to block 402 where the PLL loop divider 112 value N is set to a value that provides a desired output frequency ($f_o$) from the VCO 110. From block 402 flow proceeds to block 404 where the clock circuit 204 is initiated. From block 404, flow proceeds to block 406 where the bias control voltage is swept, i.e., altered or varied. In accordance with the preferred embodiment, the binary counter 206 driven by the clock provided by the clock control unit 204 in conjunction with DAC 208 generate a saw tooth signal that sweeps the VCO bias control signal 118. The DAC 208 output thereby alters or varies the VCO bias point.

From block 406, flow proceeds to block 408 where peak voltage detector 202 begins to search for a maximum or minimum peak voltage on the VCO control line 116. Of note, the clock signal 210 period is much longer than the lock time of the PLL 110 so as to ensure that the control line voltage 116 is updated to reflect change in the VCO bias point.

From block 406, flow proceeds to block 408 where a determination is made whether a maximum or minimum peak voltage is detected on the VCO control line 116. If not, flow proceeds to block 406 where the bias control voltage is varied and the VCO control line is searched for a maximum or minimum value.

Upon detection of a maximum or minimum voltage on VCO control line 116 at block 410, the clock pulse generator (not shown) which supplies the clock signal 210 is disabled at block 412. From block 412, flow proceeds to block 414 where counter 206 provides a constant output which when converted by DAC 208, provides a bias voltage for VCO 110 to PLL 100. Based on the specific design parameters of counter 206, this will likely occur at a defined number of clock cycles.

The VCO bias procedure as set forth herein is simple, fast, and cost efficient. In addition, it can be performed on a resident device, such as a two-way radio or paging radio receiver periodically or at each power up cycle, so as to avoid any disruption of service or other operation.

While the preferred embodiment of the invention has been illustrated and described, it will be clear that the invention is not so limited. Numerous modifications, changes, variations, substitutions and equivalents will occur to those skilled in the art without departing from the spirit and scope of the present invention as defined by the appended claims. Notwithstanding, it will be appreciated by those skilled in the art that the invention of the present application operates to provide a self-biasing VCO that avoids the limitations of the prior art; namely, manual, labor intensive, high-cost, and error-prone VCO biasing.

What is claimed is:

1. A self-biasing Phase Lock Loop (PLL) circuit having a voltage controlled oscillator (VCO), said circuit further comprising:

a signal generator, coupled to a bias control line of the VCO, for sweeping the bias control line with a signal of variable amplitude;

a detector, coupled to a voltage control line of the VCO, for detecting a maximum or minimum signal on the VCO voltage control line;

a counter, coupled to the detector, for sampling said maximum or minimum signal, wherein the counter samples the maximum/minimum signal for a predetermined number of clock cycles approximating a time required for the PLL to reach a tuned bias state; and a converter coupled to the counter for converting the sampled signal into a VCO bias signal.

2. The circuit of claim 1, wherein the counter is an up/down binary counter.

3. The circuit of claim 1, wherein the converter is a digital-to-analog converter.

4. A wireless communications device having a phase locked loop frequency synthesizer comprising:

a voltage controlled oscillator (VCO) for receiving a control signal and providing an output signal ($f_o$) and further adapted to receive a bias control signal;

a signal generator, coupled to a bias control line of the VCO, for sweeping the bias control line with a signal of variable amplitude;

a detector, coupled to a voltage control line of the VCO, for detecting a maximum or minimum signal on the VCO voltage control line;

a counter, coupled to the detector, for sampling said maximum or minimum signal, wherein the counter samples the maximum/minimum signal for a predetermined number of clock cycles approximating a time required for the PLL to reach a tuned bias state; and a converter coupled to the counter for converting the sampled signal into a VCO bias signal.

5. A method for biasing a Voltage Controlled Oscillator (VCO) in a Phase Locked Loop (PLL) frequency synthesizer comprising the steps of:

initiating a counter;

setting the PLL to produce a known VCO frequency output;

sweeping a VCO bias control line with a signal of altering amplitude;

monitoring a VCO voltage control line for a maximum or minimum peak voltage value by sampling the VCO voltage control line over a period longer in duration than the period established by the phase locked loop's lock time;

halting a count upon detection of said maximum or minimum peak voltage value; and converting the count to a VCO bias signal for delivery to the VCO.

6. The method of claim 5 wherein the step of monitoring the VCO voltage control line further comprises the step of sampling the VCO voltage control line at a rate slower than the rate established by the phase locked loop's lock time.

* * * * *